(12) United States Patent
Okayama et al.

(10) Patent No.: US 7,733,650 B2
(45) Date of Patent: Jun. 8, 2010

(54) MOTOR CONTROLLER

(75) Inventors: Hideharu Okayama, Fukuoka (JP); Kenji Isomoto, Fukuoka (JP); Shuhei Nohara, Fukuoka (JP); Toshio Omata, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 618 days.

(21) Appl. No.: 11/630,414

(22) PCT Filed: Jun. 2, 2005

(86) PCT No.: PCT/JP2005/010158

§ 371 (c)(1),
(2), (4) Date: Mar. 29, 2007

(87) PCT Pub. No.: WO2006/001163

PCT Pub. Date: Jan. 5, 2006

(65) Prior Publication Data

US 2007/0258194 A1    Nov. 8, 2007

(30) Foreign Application Priority Data

Jun. 24, 2004  (JP) .............................. 2004-185784

(51) Int. Cl.
*H05K 7/20* (2006.01)
*F28F 7/00* (2006.01)
*H01L 23/34* (2006.01)

(52) U.S. Cl. .................... 361/704; 165/185; 257/719; 361/707; 361/715; 361/719; 361/820

(58) Field of Classification Search .................... None
See application file for complete search history.

(56) References Cited

U.S. PATENT DOCUMENTS

| 5,648,893 | A  | * | 7/1997  | Loo et al. ............... 361/820 |
| 6,061,235 | A  | * | 5/2000  | Cromwell et al. ......... 361/690 |
| 6,084,178 | A  | * | 7/2000  | Cromwell ............... 174/383 |
| 6,549,418 | B1 | * | 4/2003  | Deeney ................. 361/736 |
| 6,560,115 | B1 | * | 5/2003  | Wakabayashi et al. ...... 361/728 |
| 6,634,095 | B2 | * | 10/2003 | Colbert et al. ............. 29/740 |

(Continued)

FOREIGN PATENT DOCUMENTS

JP    3-73461 U    7/1991

(Continued)

OTHER PUBLICATIONS

Chinese Office Action Dated Sep. 12, 2008.

*Primary Examiner*—Gregory D Thompson
(74) *Attorney, Agent, or Firm*—Sughrue Mion, PLLC

(57) ABSTRACT

A motor controller which eliminates a positioning operation between a power semiconductor element and a base plate to improve the assembly process is provided. The motor controller has a power semiconductor element closely contacted with a heatsink and mounted in a first base plate, wherein a spacer having an engaging section formed therein as a hole for the power semiconductor element is interposed between the heatsink and the base plate, and the power semiconductor element is positioned in the spacer. Further, the peripheral wall of the hole is arranged so as to shut off a space between a terminal projecting from the side of the power semiconductor element and the heatsink.

9 Claims, 5 Drawing Sheets

U.S. PATENT DOCUMENTS

| | | | |
|---|---|---|---|
| 6,891,725 B2 * | 5/2005 | Derksen | 361/704 |
| 7,035,105 B2 * | 4/2006 | Yamaguchi | 361/707 |
| 7,120,027 B2 * | 10/2006 | Yatskov et al. | 361/716 |
| 7,206,206 B2 * | 4/2007 | Lin et al. | 361/719 |
| 2004/0165356 A1 * | 8/2004 | Mun et al. | 361/715 |
| 2005/0286233 A1 * | 12/2005 | Lin et al. | 361/719 |

FOREIGN PATENT DOCUMENTS

| | | |
|---|---|---|
| JP | 4-93191 U | 8/1992 |
| JP | 11-346477 A | 12/1999 |
| JP | 2000-156584 A | 6/2000 |
| JP | 2001-242347 A | 9/2001 |

* cited by examiner

MOTOR CONTROLLER

TECHNICAL FIELD

The present invention relates to a motor controller such as an inverter and a servo amplifier, and more particularly, to a positioning attachment structure of a power semiconductor element to a base plate.

RELATED ART

Since a power semiconductor element generating high-temperature heat is used for a motor controller such as an inverter, a cooling effect is improved by bringing the power semiconductor element into close contact with a heatsink (for example, see Patent Document 1).

The known motor controller such as an inverter is configured as shown in FIGS. 4 and 5.

In FIGS. 4 and 5, reference numeral 11 represents a heatsink where bosses 12c are provided at four corners (c) and a first base plate 14 is placed on the bosses 12c. A power semiconductor element 13 such as an IGBT (Insulated Gate Bipolar Transistor) is mounted on the bottom surface of the base plate 14. In addition, the power semiconductor element 13 is closely attached to the top surface of the heatsink 11 with screws 16. In addition, studs 12d and the screws 16 are screwed to the bosses 12c with the base plate 14 therebetween. A second base plate 15 is placed on the top surfaces of the studs 12d and a base plate attachment seat 14c provided on the top surface of the base plate 14.

In this configuration, positioning attachment of the power semiconductor element 13 to the first base plate 14 is performed as follows.

First, the power semiconductor element 13 is temporarily fixed to the top surface of the heatsink 11 with screws 18.

Next, while positioning terminals of the power semiconductor elements 13 with respect to through-holes (not shown) of the first base plate 14, it is checked whether or not the positions of screw-passing holes 14a and the positions of the bosses 12c of the base plate 14 are matched with each other is verified.

When the positions are not matched with each other, the positions are corrected by adjusting the position of the power semiconductor element 13. When the positions are matched with each other or the positions of the attachment holes and the positions of the bosses 12c on the base plate 14 are matched with each other by correcting the position of the power semiconductor element 13, the base plate 14 is fastened to the bosses 12c by using the screws 16 and the studs 12d. Then, the screws 18 are fastened to the holes 14d for fastening the screws provided on the base plate 14 with a driver to securely fix the power semiconductor elements 13 on the top surface of the heatsink 11.

After the base plate 14 is fastened to the bosses 12c, the terminals of the power semiconductor elements 13 are soldered to the base plate 14.

After the terminals of the power semiconductor element 13 are soldered to the base plate 14, the second base plate 15 is fixed to the top surfaces of the studs 12d and the top surfaces of the base plate attachment seats 14c provided on the base plate 14 with screws 17.

Patent Document 1: Unexamined Japanese Patent Application Publication No. Hei11-346477

DISCLOSURE OF THE INVENTION

Problem to be Solved by the Invention

However, in related art having such a configuration, since a base plate is fixed by fasten screws after temporarily fixing a power semiconductor element to a heatsink and positioning terminals of the power semiconductor element with respect to through holes of the base plate, there are the following problems.

(1) It takes a time to fit the terminals of the power semiconductor element to the through-holes.

(2) Since the power semiconductor element is fastened after attachment of the base plate, the holes for fastening the screws are provided on the base plate. Therefore, the base plate is enlarged.

To solve the problem, there is an object of the present invention to provide a motor controller which eliminates a positioning operation between the power semiconductor element and the base plate to improve assemblability.

Means for Solving the Problem

To solve the problem, the present invention is configured as follows.

According to claim 1 of the invention, there is provided a motor controller including:

a power semiconductor element closely contacted with a heatsink and mounted on a first base plate, wherein a spacer is interposed between the heatsink and the base plate, and the power semiconductor element is positioned in the spacer.

According to claim 2 of the invention, there is provided the motor controller, further including:

an engaging section engaging with the power semiconductor element provided in the spacer.

According to claim 3 of the invention, there is provided the motor controller, wherein the engaging section is formed as a hole.

According to claim 4 of the invention, there is provided the motor controller, wherein the peripheral wall of the hole is arranged to shut off a space between a terminal projecting from the side of the power semiconductor element and the heatsink.

According to claim 5 of the invention, there is provided the motor controller, wherein a space is formed between the side of the power semiconductor element from which no terminal projects and the side wall of the hole corresponding to the side of the power semiconductor element, and a projection is formed toward the space from the side wall of the hole.

According to claim 6 of the invention, there is provided the motor controller, wherein the projection is disposed in a part where the rotation of the power semiconductor element stops by a fastening torque at the time of fastening the projections with a screw.

According to claim 7 of the invention, there is provided the motor controller, wherein the height of the projection is substantially equal to the height of the power semiconductor element.

According to claim 8 of the invention, there is provided the motor controller, wherein the base plate is attached to the spacer.

According to claim 9 of the invention, there is provided the motor controller, wherein the spacer is formed of a heat insulating resin.

According to claim 10 of the invention, there is provided the motor controller, wherein the first base plate is placed on the side wall of the spacer, a plurality of bosses is formed in the top portion of the side wall, and at least a second base plate is placed on the bosses.

According to claim 11 of the invention, there is provided the motor controller, wherein boss-passing sections are formed in the second base plate placed on the bosses for the second base plate, the bosses for a third base plate pass through the boss-passing sections, and the third base plate is placed on the bosses for the third base plate.

According to claim 12 of the invention, there is provided the motor controller, wherein the boss-passing sections are notches or holes formed in the second base plate.

Advantage of the Invention

The present invention has the following advantages.

(1) According to claims 1 to 3 and claims 5 to 8 of the invention, since the positioning of a power semiconductor element on a first base plate can be easily performed, it is possible to eliminate a fitting operation of the terminal of the power semiconductor element and the hole of the first plate. In addition, since the positioning operation may be performed only by the spacer, it is possible to reduce the number of parts.

(2) According to claim 4 of the invention, it is possible to secure the insulating distance between the first base plate and the power semiconductor element, thereby minimizing the device.

(3) According to Claim 9 of the invention, it is possible to block heat radiation from the heatsink. Accordingly, it is possible to decrease a distance between the first base plate and the heatsink, thereby minimizing the device.

(4) According to claims 10 to 12 of the invention, it is possible to place a plurality of base plates on the heatsink by a simple configuration.

DESCRIPTION OF REFERENCE NUMERALS AND SIGNS

1: HEATSINK
1a: FIN
1b: POSITIONING HOLE
1c: SCREW HOLE
2: SPACER
2a: POSITIONING PROJECTION
2b: PERIPHERY
2c: FIRST BOSS
2d: SECOND BOSS
2e: ENGAGING SECTION (HOLE)
2f: PROJECTION
3: POWER SEMICONDUCTOR ELEMENT
4: FIRST BASE PLATE
4a: SCREW-PASSING HOLE
4b: NOTCH
4c: HOLDING SEAT
5: SECOND BASE PLATE
5a: SCREW-PASSING HOLE
6: FIRST BASE PLATE FIXING SCREW
7: SECOND BASE PLATE FIXING SCREW
8: POWER SEMICONDUCTOR ELEMENT FIXING SCREW
11: HEATSINK
12c: BOSS
12d: STUD
13: POWER SEMICONDUCTOR ELEMENT
14: FIRST BASE PLATE
14a: SCREW-PASSING HOLE
14c: BASE PLATE ATTACHMENT SEAT
14d: SCREW FIXING HOLE
15: SECOND BASE PLATE
16: FIRST BASE PLATE FIXING SCREW
17: SECOND BASE PLATE FIXING SCREW
18: POWER SEMICONDUCTOR ELEMENT FIXING SCREW

BEST MODE FOR CARRYING OUT THE INVENTION

Hereinafter, embodiments of the invention will be described with reference to the drawings.

Embodiment

Figure 1:
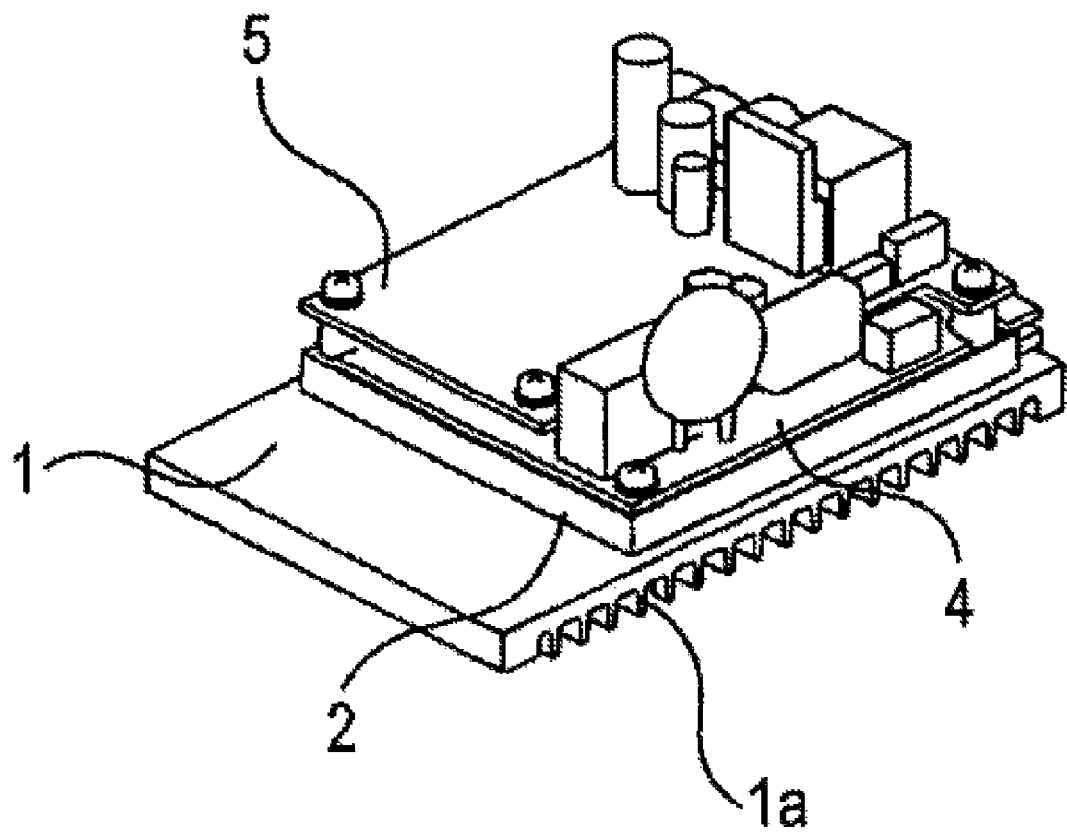
FIG. 1 is a perspective view showing a motor controller of the present invention.
Figure 2:
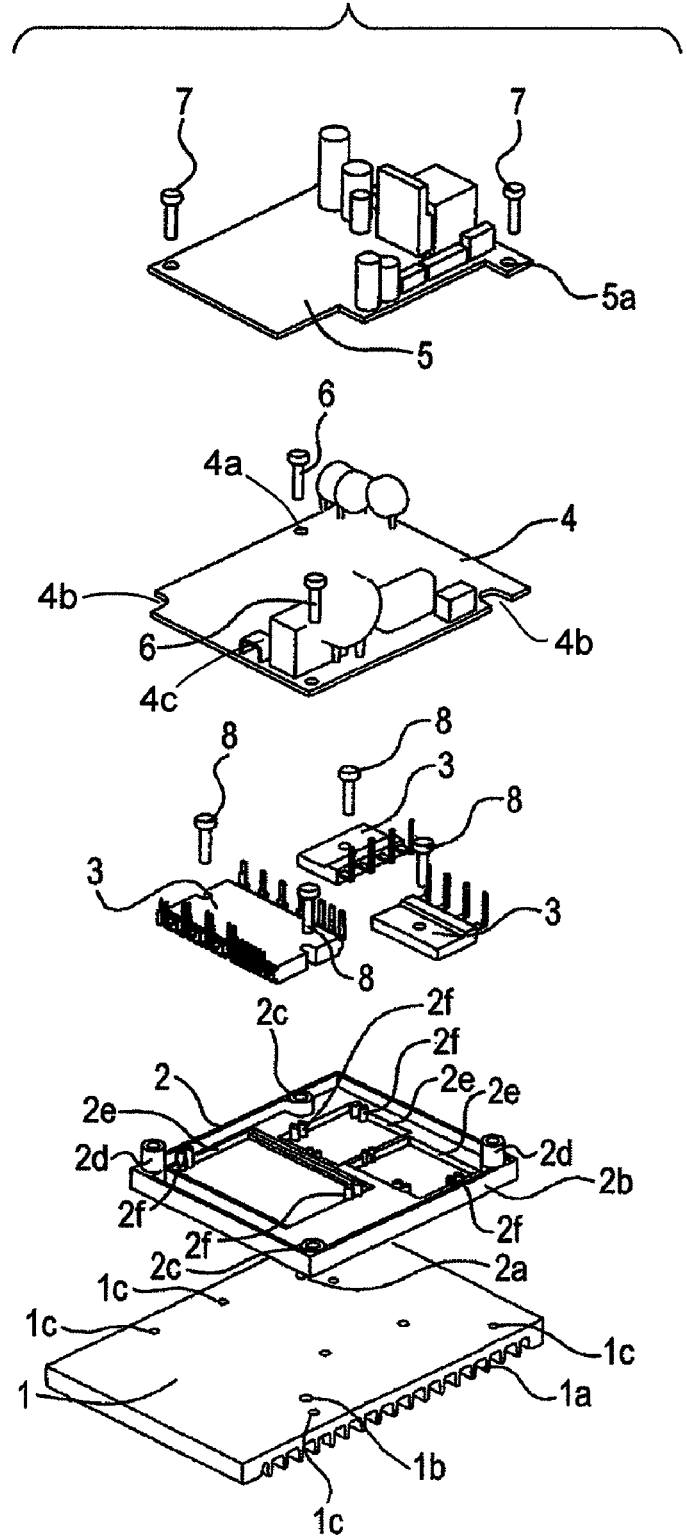
FIG. 2 is an exploded perspective view of the motor controller shown in FIG. 1.
Figure 3:
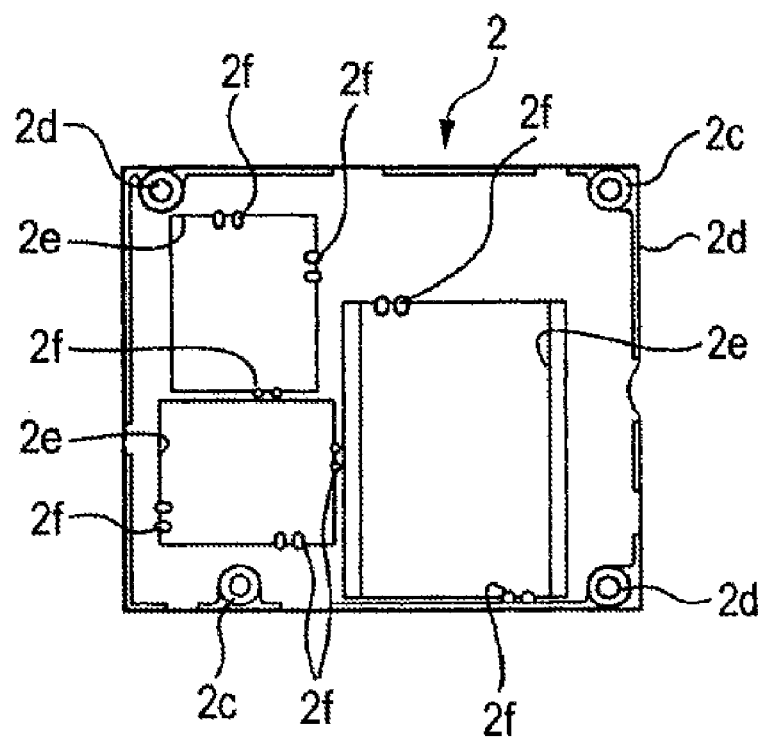
FIG. 3A is a plan view of the spacer of FIG. 1
FIG. 3B is a front view of the spacer of FIG. 1.
Figure 3:
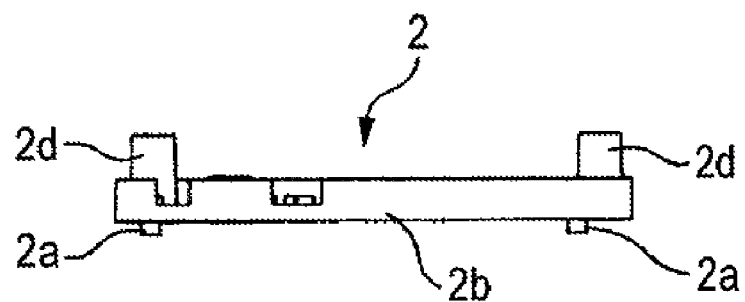
Figure 4:
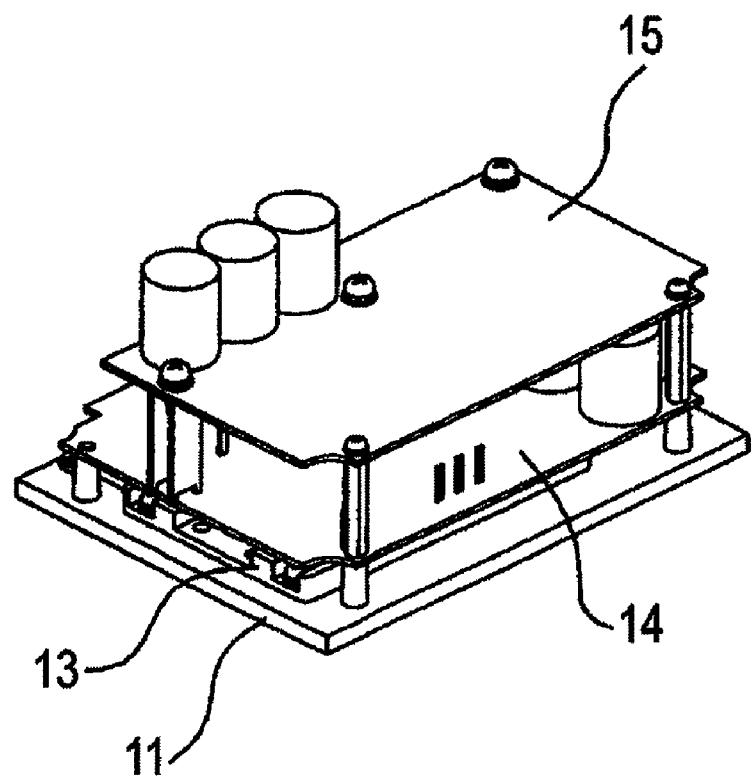
FIG. 4 is a perspective view of a motor controller in related art.
Figure 5:
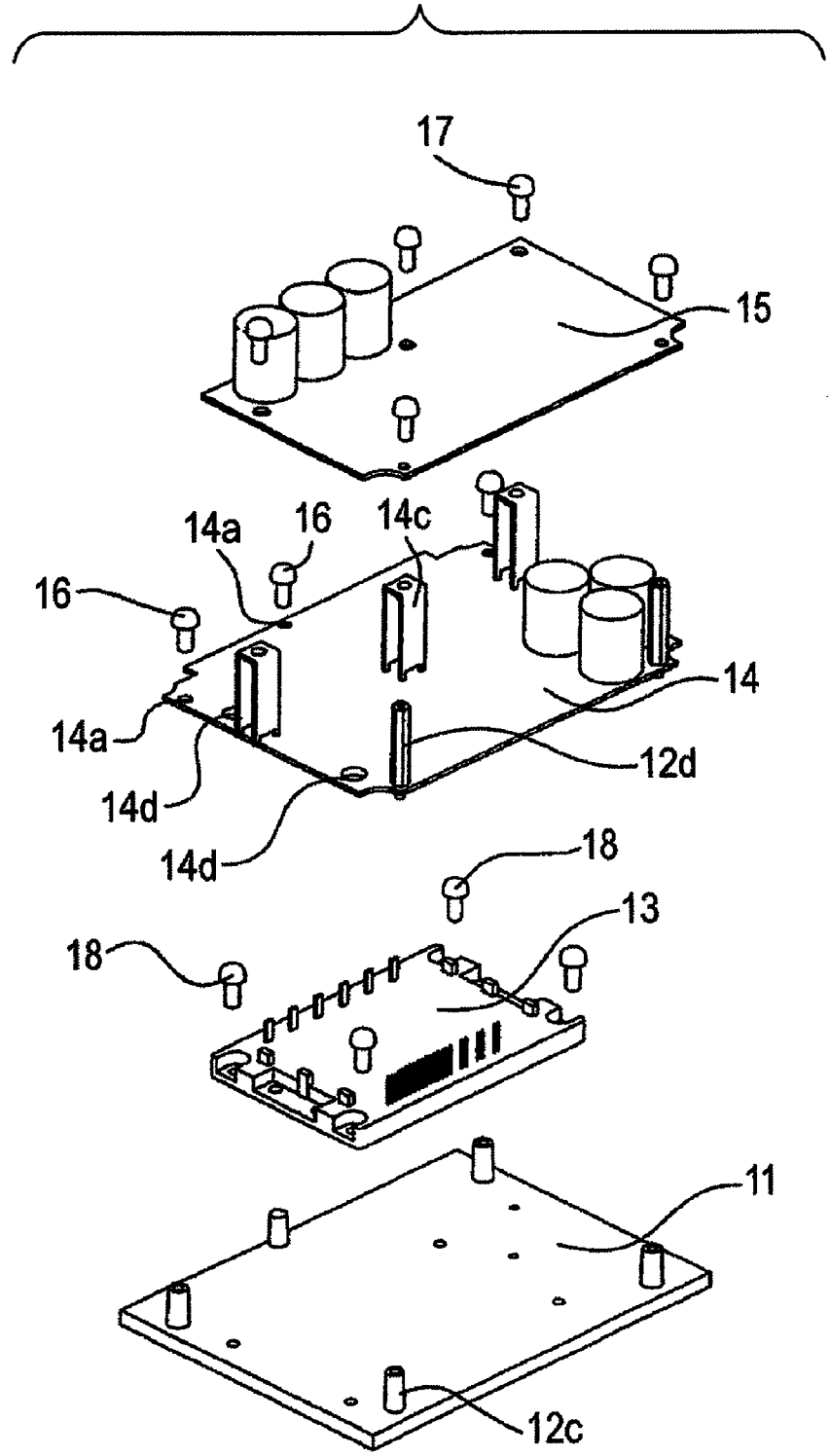
FIG. 5 is an exploded perspective view of the motor controller shown in FIG. 4.

FIG. 1 is a perspective view showing a motor controller of the present invention. FIG. 2 is an exploded perspective view of the motor controller shown in FIG. 1.

In FIGS. 1, 2, 3(a), 3(b), reference numeral 1 represents a heatsink, reference numeral 2 represents a spacer in which, for example, resins having low thermal conductivity are integrated, and reference numeral 3 represents a power semiconductor element such as an IGBT, in which a plurality of terminals project in the vicinity of a side surface and extends upward from a middle. Reference numeral 4 represents a first base plate and reference numeral 5 is a second base plate.

The heatsink 1 is a rectangular solid. The top surface of the heatsink 1 has a planar shape and the bottom surface of the heatsink 1 has pins 1a. The top surface includes a positioning hole 1b for positioning the spacer 2, and a plurality of screw holes 1c for attaching the spacer 2 and the power semiconductor element 3 to the heatsink 1.

The spacer 2 placed on the top surface of the heatsink 1 is the rectangular solid as larger as or smaller than the heatsink 1 (In the present embodiment, the spacer 2 is smaller than the heatsink 1.). The spacer 2 includes positioning projections 2a provided in positions of the bottom surface corresponding to the positioning holes 1b of the heatsink 1. In addition, on the top surface, first bosses 2c having a plane surface as tall as the top surface of a periphery 2b are formed in two locations on a diagonal line or a substantially diagonal line of the periphery 2b and second bosses 2d having the plane surface taller than the top surface of a periphery 2b are formed in two locations on another diagonal line or a substantially diagonal line. The first bosses 2c are arranged to tighten the first base plate 4 with screws 6 and the second bosses 2d are arranged to tighten the second base plate 5 with screws 7. The spacer 2 includes engaging sections 2e for positioning each power semiconductor element 3 provided therein. The engaging sections 2e are holes or notches formed in the spacer 2 (holes in the present embodiment). The power semiconductor elements 3 are inserted into the engaging sections 2e formed of the holes, thereby being positioned. The peripheral wall of the hole has a height bottom than the periphery 2b to be inserted into the terminal projecting from the side of the power semiconductor element 3. Accordingly, the peripheral wall of the hole shuts off a space between the terminal of the power semiconductor element 3 and the heatsink 1 to improve insulation property between the power semiconductor element 3 and the heatsink 1.

The peripheral wall of the engaging section 2e in the spacer 2 opposite to the side without the terminal of the power semiconductor element 3 is at a distance from the side of the power semiconductor element 3 and a space is formed between the power semiconductor element 3 and the peripheral wall. In addition, at least one projection 2f (at least two bosses in the present embodiment) is formed toward the space from the peripheral wall of the engaging section 3. The projection 2f is arranged for positioning the power semiconductor element 3. Therefore, at the time of fastening the power semiconductor element 3 with screws 8, the boss 2f is formed in a position where dislocation of the power semiconductor element 3 can be prevented by the simultaneous rotation. That is, the boss 2f is disposed in a part where the rotation of the power semiconductor element 3 stops by a torque at the time of fastening the boss with the screw 8. Specifically, the power semiconductor element 3 rotates together with the screw 8 at the time of fastening the screw 8 clockwise. Then, the side of the power semiconductor element 3 is closely contacted with the peripheral wall of the engaging section. The simultaneous rotation of the power semiconductor element is shut off by the projections 2f provided in the part, thereby preventing the dislocation of the power semiconductor element.

The first base plate includes screw-passing holes 4a formed in positions corresponding to the first bosses 2c. The first base plate 4 is placed on the periphery 2b and the first bosses 2c of the spacer 2 and is fastened to the first bosses by the screws 6. Positioning of the first base plate 4 in the height direction is performed by the first bosses 2c.

The second base plate 5 is disposed in the top side of the first base plate 4 at a predetermined space. Since the second bosses 2d for placing the second base plate 5 are formed in the spacer 2, the notches 4b are provided on the first base plate 4 to avoid the interference with the second bosses 2d.

In addition, the top surface of the first base plate 4 includes holding seats 4c provided to hold the second base plate 5.

The second base plate 5 includes screw-passing holes 5a formed in positions corresponding to the second bosses 2d and positions corresponding to the notches 4b. The second base plate 5 is placed the second bosses 2d and the holding seats 4c and is fastened to the second bosses 2d and the holding seats 4c with the screws 7. Positioning of the second base plate 5 in a height direction is performed by the second bosses 2d and the holding seats 4c.

By this configuration, the positioning attachment of the power semiconductor element 3 to the first base plate 4 is performed as follows.

First, the spacer 2 is placed on the top surface of the heatsink 1. Then, the positioning projections 2a formed on the bottom surface of the spacer 2 are positioned by being inserted into the positioning holes 1b of the heatsink. Then, the power semiconductor elements 3 each are inserted into the respective engaging sections 2e. The power semiconductor element 3 is fastened to the heatsink 1 by passing the screws 8 through the power semiconductor element 3 and screwing the screws 8 with the heatsink 1 of the power semiconductor element 3.

Next, the first base plate 4 is placed on the top surfaces of the first bosses 2c and the top surface of the periphery 2b by engaging the notches 4b with the second bosses 2d of the spacer 2. Then, since the positions of the terminals of the power semiconductor elements 3 are matched with the positions of the through-holes of the first base plate 4, the terminals of the semiconductor elements 3 are smoothly inserted into the through-holes of the first base plate 4.

After the first base plate 4 is placed on the top surfaces of the first bosses 2c and on the top surface of the periphery 2b, the first base plate 4 is fastened to the heatsink 1 with the spacer 2 therebetween by passing the screws 6 through the screw-passing holes 4a of the first base plate 4 and the screw-passing holes of the first bosses 2C, and by screwing the screws 6 with the screw holes 1c of the heatsink 1.

Then, the terminals of the power semiconductor elements 3 are soldered to the first base plate 4.

Further, after the first base plate 4 is fastened to the heatsink 1, the second base plate 5 is placed on the top surfaces of the second bosses 2d and on the top surfaces of the indication seats 4c provided on the first base plate 4. A screw 7 passes through the screw-passing hole 5a of the second base plate 5 and the screw-passing hole of the second boss 2d, and is screwed to the screw hole 1c of the heatsink 1. In addition, the second base plate 5 is fixed to the heatsink 1 with the spacer 2 therebetween by passing another screw 7 through the screw-passing hole 5a of the second base plate 5 and screwing the another screw 7 with the screw hole of the holding seat 4c. Then, since the screws 7 are covered with the second bosses 2d made of a resin, it is possible to secure an insulating distance from the first base plate 4.

In the present invention, the number of the base plates may be one. A third base plate, as a third sheet of base plate, not shown may be mounted on third bosses by forming boss-passing sections through the second base plate 5 placed on the second bosses 2d and passing the third bosses formed on the spacer 2 through the boss-passing sections.

The motor controller of the present invention includes the spacer for engaging and positioning the power semiconductor element, which is interposed between the heatsink and the base plate. Therefore, the motor controller has the following operation effects.

(1) It is possible easily to perform the positioning of the power semiconductor element on the first base plate just by inserting the power semiconductor element 3 into the engaging section of the spacer. As the result, it is possible to eliminate a very difficult positioning operation between the terminals of the power semiconductor element and the holes of the first base plate in related art. In addition, since the positioning operation may be performed only by the spacer, it is possible to reduce the number of parts.

(2) Since the spacer is formed of insulating materials, it is possible to certainly secure the insulating distance by using the spacer without maintaining a large space between the first base plate and the power semiconductor element. Therefore, it is possible minimize the device.

(3) Since the spacer is made of a resin having low thermal conductivity, it is possible to block heat radiation from the heatsink by using the spacer interposed between the heatsink and the base plate. Accordingly, it is possible to place a plurality of base plates on the heatsink by decreasing a distance between the base plate and the heatsink.

INDUSTRIAL APPLICABILITY

The present invention is applied, particularly, to motor controller such as an inverter or a servo amplifier. The present invention can be used for fields of manufacturing and providing the motor controller which eliminates a positioning operation of a power semiconductor element and a base plate to improve assemblability.

The invention claimed is:

1. A motor controller comprising:
a power semiconductor element closely contacted with a heatsink and mounted on a first base plate, wherein
a spacer is interposed between the heatsink and the first base plate,
the power semiconductor element is positioned in the spacer,
the first base plate is mounted on the spacer, a first plurality of bosses are formed in the spacer, a first plurality of boss-passing sections are formed in the first base plate, and at least a second base plate is placed on the first plurality of bosses.

2. The motor controller according to claim 1, further comprising:
an engaging section engaging with the power semiconductor element provided in the spacer.

3. The motor controller according to claim 2, wherein the engaging section is formed as a hole.

4. The motor controller according to claim 3, wherein
a peripheral wall of the hole is arranged to shut off a space between a terminal projecting from a first side of the power semiconductor element and the heatsink.

5. The motor controller according to claim 3, wherein
a space is formed between a side of the power semiconductor element from which no terminal projects and a side wall of the hole in which the power semiconductor element is provided, and
a projection is formed toward the space from the side wall of the hole.

6. The motor controller according to claim 5, wherein
the projection is disposed in a part where a rotation of the power semiconductor element stops by a fastening torque at the time of fastening the power semiconductor element with a screw.

7. The motor controller according to claim 5, wherein
the height of the projection is substantially equal to the height of the power semiconductor element.

8. The motor controller according to claim 1, wherein
the spacer is formed of a heat insulating resin.

9. The motor controller according to claim 1, wherein
the first plurality of boss-passing sections are notches or holes formed in the first base plate.

* * * * *